(12) United States Patent
Mutnury et al.

(10) Patent No.: US 10,319,454 B2
(45) Date of Patent: Jun. 11, 2019

(54) SYSTEM AND METHOD FOR SIMULATING A MEMORY TECHNOLOGY

(71) Applicant: Dell Products, LP, Round Rock, TX (US)

(72) Inventors: Bhyrav M. Mutnury, Round Rock, TX (US); Douglas S. Winterberg, Austin, TX (US); Stuart Allen Berke, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 182 days.

(21) Appl. No.: 14/473,697

(22) Filed: Aug. 29, 2014

(65) Prior Publication Data

US 2016/0064100 A1    Mar. 3, 2016

(51) Int. Cl.
*G11C 29/10* (2006.01)
*G11C 29/54* (2006.01)

(52) U.S. Cl.
CPC .............. *G11C 29/10* (2013.01); *G11C 29/54* (2013.01)

(58) Field of Classification Search
CPC ...... G11C 29/10; G11C 29/54; G06F 17/5036
See application file for complete search history.

(56) References Cited

U.S. PATENT DOCUMENTS

| 2008/0010622 | A1 | 1/2008 | Hsu et al. |
| 2008/0280566 | A1 | 11/2008 | Yen et al. |
| 2009/0245084 | A1* | 10/2009 | Moffatt ................ G06F 17/142 370/208 |

* cited by examiner

*Primary Examiner* — Vuthe Siek
*Assistant Examiner* — Aric Lin
(74) *Attorney, Agent, or Firm* — Larson Newman, LLP

(57) ABSTRACT

A method includes modeling a design of a memory channel to provide a plurality of transfer functions associated with the design and multiplying an input spectrum with each of the transfer functions to provide a plurality of results. The method further includes summing the results to provide an output spectrum for the design, performing an inverse Fast Fourier Transform (FFT) on the output spectrum to provide an output signal for the design, and determining a bit error rate (BER) for the design based on the output signal.

14 Claims, 5 Drawing Sheets

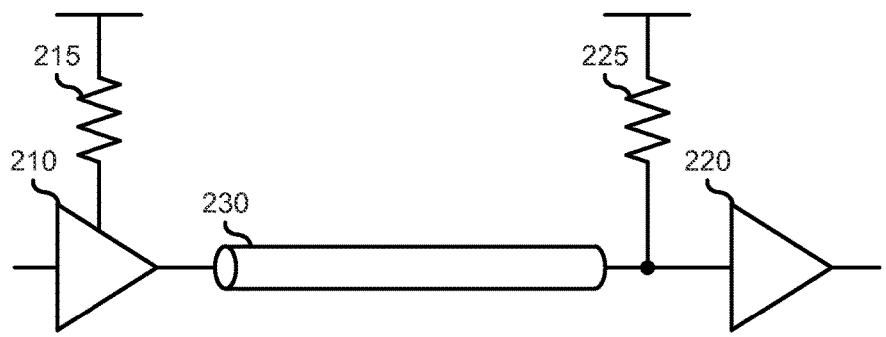
FIG. 2
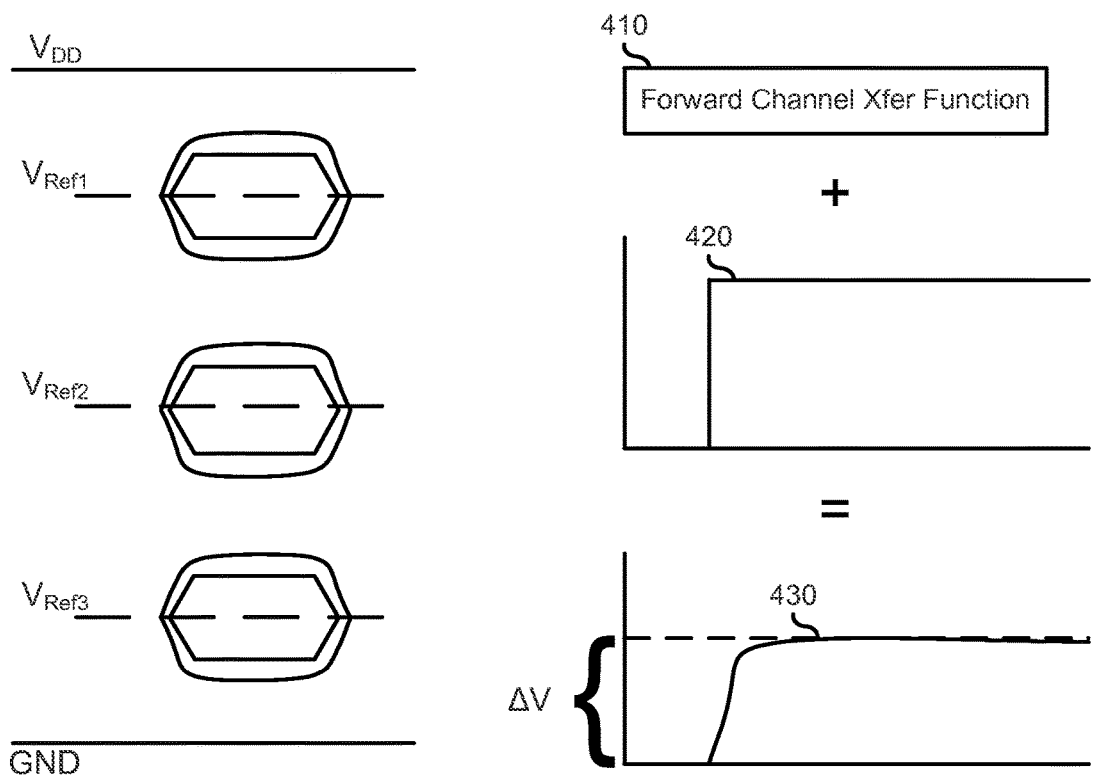
FIG. 3
FIG. 4

SYSTEM AND METHOD FOR SIMULATING A MEMORY TECHNOLOGY

FIELD OF THE DISCLOSURE

This disclosure generally relates to information handling systems, and more particularly relates to a system and method of simulation for next generation memory technology.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

Double-Data Rate-4 (DDR4) memory is a high speed memory technology that supports data transfer rates of between 2133 and 3200 million transfers per second (MT/s). Previous memory technologies included sufficient margins to permit a specific bit-error rate (BER) of zero (0). However, noise and jitter margins for DDR4 have shrunk to the point that a specification of a zero BER is impractical. As such, the specification for DDR4 provides a BER of $10^{-16}$ errors per bit, which corresponds to the average statistical transmission of $10^{16}$ bits or more without error. Future memory technologies will likely continue to specify low BER.

Validation of memory channels in an information handling system has typically included time-domain design simulation, such as using a Spice simulator, in conjunction with on-system testing of the memory channels to ensure that the information handling system meets the desired performance level. However, the large number of cycles necessary to validate to the DDR4 BER makes full simulation impractical, and lengthens the duration of on-system testing.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which:

FIG. 2 is a block diagram illustrating a memory channel according to an embodiment of the present disclosure;

FIG. 3 is a plot of eye diagrams associated with the memory channel of FIG. 2;

FIG. 4 is an illustration of a method for determining a reference voltage for the memory channel of FIG. 2;

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

Figure 1:
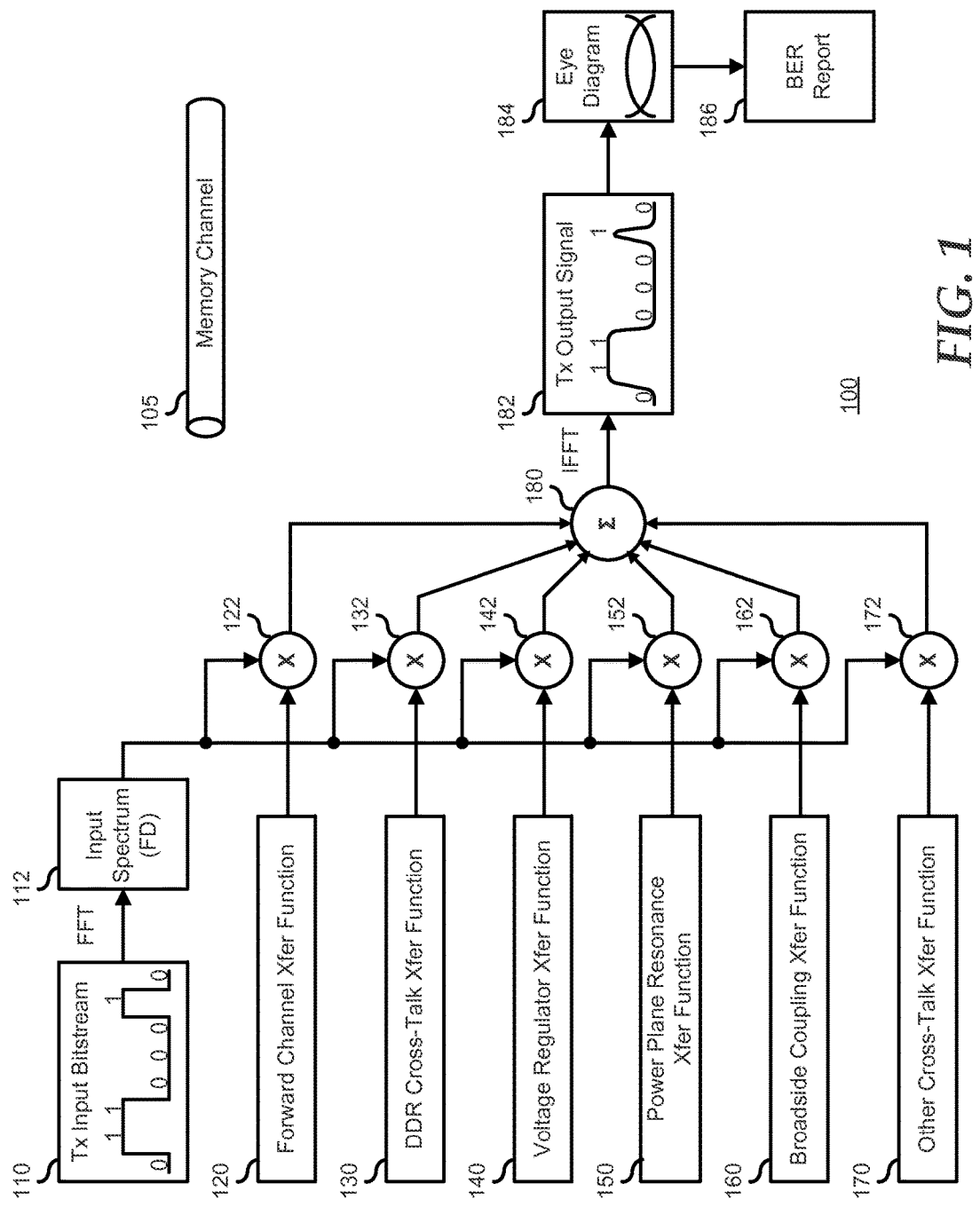
FIG. 1 is a block diagram illustrating a simulation environment according to an embodiment of the present disclosure.

FIG. 1 illustrates a simulation environment 100 for simulating a next generation memory technology 100, such as for simulating one or more DDR4 channel on an information handling system. Simulation environment 100 operates on an information handling system to evaluate one or more memory channel 105 on a processing system that is being evaluated or designed. As such, simulation environment 100 receives inputs, performs processing steps on the inputs, and evaluates the results of the processing steps to determine if memory channel 105 design is robust enough to meet a specified BER. In a particular embodiment, the inputs can be processed individually, as an entire group, or as a subset of the inputs, in order to evaluate the effects on the BER, based upon the combinations of inputs that are processed. In a particular embodiment, if the evaluation reveals that memory channel 105 design is not robust enough to meet the BER, then one or more input is manipulated to improve the design, and the processing and evaluation is repeated to determine if the manipulated input has resulted in an improved design. Simulation environment 100 can be utilized to simulate DDR4 memory channels, DDR5 memory channels, or other types of memory channels.

Simulation environment 100 includes a transmission input bitstream input 110, one or more forward channel transfer function input 120, a DDR cross-talk transfer function input 130, a voltage regulator transfer function input 140, a power plane resonance transfer function input 150, a broadside coupling transfer function 160, and an other interface cross-talk transfer function input 170. Transmission input bitstream input 110, represents a simulation of a stream of data that is to be transmitted on memory channel 105, and includes a substantially greater number of bits than is typically associated with a time-domain design simulation of memory channel 105. For example, a typical time-domain design simulation may consist of less than 1000 bits, while transmission input bitstream input 110 can include $10^6$ to $10^{16}$ bits. In a particular embodiment, transmission input bitstream input 110 is a randomly generated bitstream. In another embodiment, transmission input bitstream input 110 includes one or more sequences of bits that are chosen based upon a designer's knowledge of certain worst case or corner conditions for memory channel 105. Here, the bit sequences can be separated by random bit sequences, as needed or desired.

Forward channel transfer function input 120 represents a frequency-domain representation of a relation between an input provided to memory channel 105 and the resulting output. DDR cross-talk transfer function input 130 represents a frequency-domain representation of a relation between the signals carried on memory channel 105 and the signals carried on one or more adjacent memory channels. Voltage regulator transfer function input 140 represents a frequency-domain representation of a relation between the signals carried on memory channel 105 and the operation of one or more voltage regulator on the processing system. Power plane resonance transfer function input 150 represents a frequency-domain representation of a relation between the signals carried on memory channel 105 and the operation of one or more power rail and ground plane of the processing system. Broadside coupling transfer function 160 represents a frequency-domain representation of a relation between the signals carried on memory channel 105 and the coupling effects of traces on a circuit board of the processing system that are proximate to the memory channel. In a particular embodiment, broadside coupling transfer function 160 includes both broadside effects and edge effects. Other interface cross-talk transfer function input 170 represents a frequency-domain representation of a relation between the signals carried on memory channel 105 and the signals carried on other interfaces of the processing system, such as PCIe or SATA lanes or the like In a particular embodiment, one or more of forward channel transfer function input 120, DDR cross-talk transfer function input 130, voltage regulator transfer function input 140, power plane resonance transfer function input 150, broadside coupling transfer function 160, and other interface cross-talk transfer function input 170 is provided based upon a circuit simulation of memory channel 105 and the various transfer function mechanisms, and is received from a circuit simulator such as a SPICE simulator or the like.

In operation, simulation environment 100 receives transmission input bitstream input 110, and performs a Fast-Fourier Transformation (FFT) on the transmission input bitstream input to provide a frequency-domain representation of an input spectrum 112 associated with the transmission input bitstream input. A response of memory channel 105 to input spectrum 112 is generated for each of transfer functions 120, 130, 140, 150, 160, and 170 by multiplying the input spectrum with each of the transfer functions. Here, input spectrum 112 is multiplied with forward channel transfer function input 120 by a multiplier 122, with DDR cross-talk transfer function input 130 by a multiplier 132, with voltage regulator transfer function input 140 by a multiplier 142, with power plane resonance transfer function input 150 by a multiplier 152, with broadside coupling transfer function 160 by a multiplier 162, and with other interface cross-talk transfer function input 170 by a multiplier 172. A complete response of memory channel 105 to input spectrum 112 is generated by summing the individual transfer function responses from multipliers 122, 132, 142, 152, 162, and 172 in an adder 180. An inverse FFT (IFFT) is performed on the complete response to provide a transmission output signal output 182. Transmission output signal 182 is sampled to provide an eye diagram 184 of the transmission output signal, and a BER report 186 is provided based upon the eye diagram.

Simulation system 100 provides for the flexible evaluation of memory channel 105. This flexibility is due to the fact that the FFT on transmission input bitstream input 110 only needs to be performed once to obtain input spectrum 112, and a FFT is not necessary unless the transmission input bitstream is changed. However, once input spectrum 112 is generated, multiple evaluations are readily made by varying one or more of transfer functions 120, 130, 140, 150, 160, and 170, by eliminating one or more of the transfer function responses from multipliers 122, 132, 142, 152, 162, and 172 from adder 180, or by a combination thereof.

In a particular embodiment, the evaluation of multiple memory configurations on the processing system is performed by changing forward channel transfer function 120 to capture the various memory configurations. For example, the circuit simulator can provide one forward channel transfer function input associated with a memory channel that is populated with only one dual in-line memory module (DIMM) in a memory socket that is closest to the transmitter, can provide another forward channel transfer function input associated with a memory channel that is populated with only one DIMM in a memory socket that is furthest from the transmitter, and can provide yet other forward channel transfer function inputs associated with memory channel that is populated with more than one DIMM in various memory sockets, as needed or desired.

In another embodiment, one or more of transfer functions 120, 130, 140, 150, 160, and 170 are configured to provide various performance conditions for memory channel 105 with respect to the particular transfer function. For example, DDR cross-talk transfer function 130 can be modeled to consider different board characteristics that are associated with different materials of the circuit board used in the processing system. In another example, different noise immunity guard bands can be provided to one or of transfer functions 120, 130, 140, 150, 160, and 170.

In a particular embodiment, simulation environment 100 includes one or more additional adder similar to adder 180. Here, simulation environment 100 operates to evaluate multiple configurations simultaneously by multiplying input spectrum 112 with each of the various forward channel transfer function inputs, as needed or desired. In another embodiment, when the responses from multipliers 122, 132, 142, 152, 162, and 172 are generated, the responses are stored in a memory of the information handling system for use in various evaluations, as needed or desired. In this way, the processing resources utilized in generating the responses is conserved, such that, if one of the responses is needed for a different evaluation, the response is recalled from memory, rather than being recalculated for that particular evaluation.

In another embodiment, when BER report 186 indicates that the design of memory channel 105 design is not robust enough to meet the specified BER, eye diagram 184 is evaluated to determine the portion of transmission input bitstream 110 that is associated with the failing case that led to the determination. Here, a designer can evaluate the failing case to determine a cause of the failure, in another embodiment, one or more of transfer functions 120, 130, 140, 150, 160, and 170 can be removed from the evaluation, either alone, or in combination with other transfer functions, until BER report 186 indicates that the particular evaluation has resulted in a passing BER. Here, the transfer function 120, 130, 140, 150, 160, or 170 that is associated with the failing BER can be quickly identified, and a designer can evaluate the conditions and assumptions that are incorporated into the transfer function to determine if the failure is real, or can modify the design to improved the performance of the design with respect to the transfer function associated with the failing BER.

FIG. 2 illustrates a simple one load memory channel 200 including a transmitter 210, a transmit-side resistor 215, a receiver 220, an open-drain termination resistor 225, and a channel trace 230. Memory channel 200 operates using a pseudo-open drain termination scheme with a strong pull-down, such as through a FET transistor in transmitter 210, and a weak pull-up termination through open-drain termination resistor 225. The skilled artisan will recognize that in the pseudo-open drain termination scheme, the reference voltage for the signal bits transmitted on channel trace 230 is not fixed at half the supply voltage, but is floating at a voltage level that is determined by the relative values of transmitter-side resistor 215 and open-drain termination resistor 225, as illustrated in FIG. 3. In a particular embodiment, transmission input bitstream input 110 of FIG. 1 includes information related to the voltage swing of the input bits of the bitstream. Thus, the voltage level of the reference voltage established on memory channel 200 is included in transmission input bitstream input 110. The skilled artisan will recognize that a typical memory channel can include multiple loads, or receivers, connected to the memory channel, such as 2 DIMMs per channel, 3 DIMMs per channel, or more.

FIG. 4 illustrates how the reference voltage for a memory channel similar to memory channel 200 is determined for inclusion in a transmission input bitstream input similar to transmission input bitstream input 110. A forward channel transfer function 410 for the memory channel is provided based upon a circuit simulation of the memory channel, including the evaluation of the associated transmit-side resistance and open-drain termination resistance. A step input 420 is provided to forward channel transfer function 410 to obtain a step response 430 to the step input. A voltage difference is determined between the initial value of the output of the memory channel, and the final output of the memory channel. The reference voltage for the particular configuration of the memory channel is then derived as:

$$V_{Ref} = \Delta V/2 \qquad \text{Equation 1}$$

where $V_{Ref}$ is the reference voltage and $\Delta V$ is the voltage difference.

Figure 5:
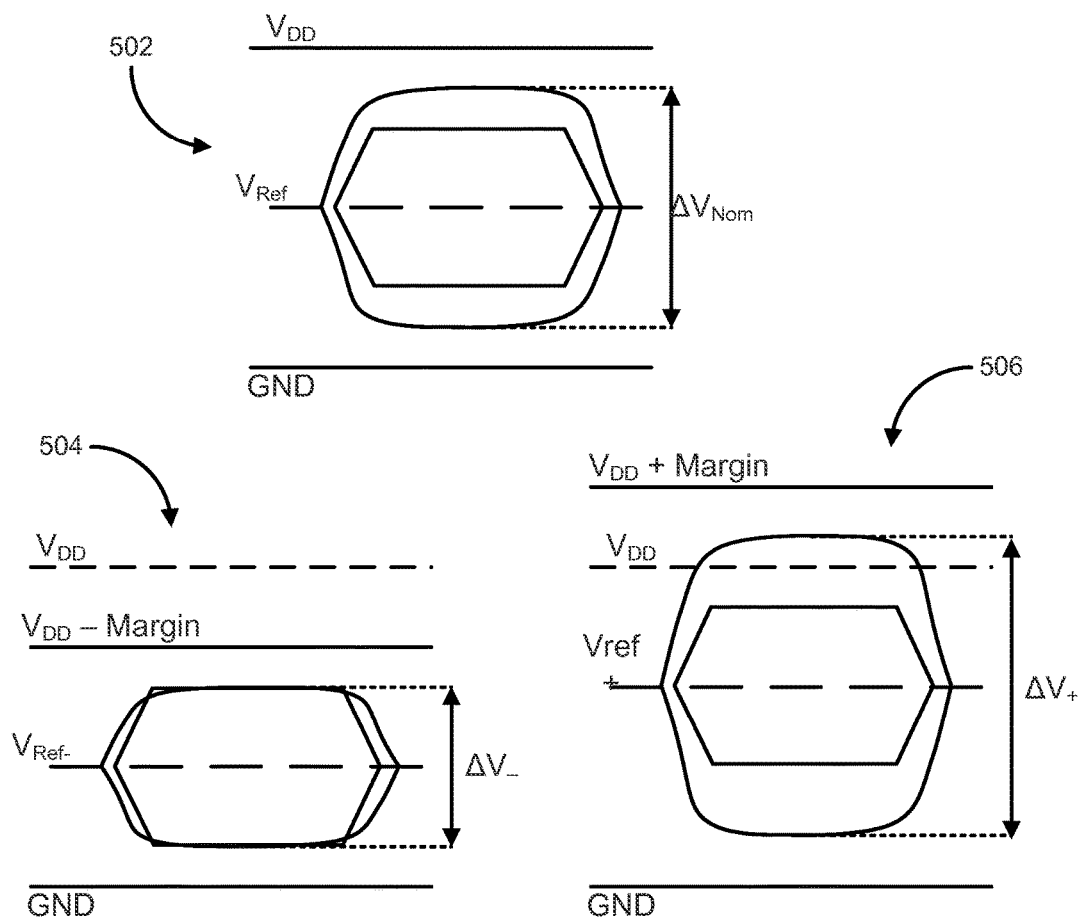
FIG. 5 illustrates plots of eye diagrams associated with different voltage margins for the memory channel of FIG. 2.

FIG. 5 illustrates margining of a supply voltage and its effect on the resulting signal eye. In a nominal case 502, the voltage supply is provided as $V_{DD}$, and the voltage swing associated with the eye is shown as $\Delta V_{Nom}$. A negative margin case 504 is shown where a negative margin is provided as $V_{DD-}$, and the voltage swing associated with the eye is show as $\Delta V_{Ref-}$. A positive margin case 506 is shown where a positive margin is provided as $V_{DD+}$, and the voltage swing associated with the eye is show as $\Delta V_{Ref+}$.

Figure 6:
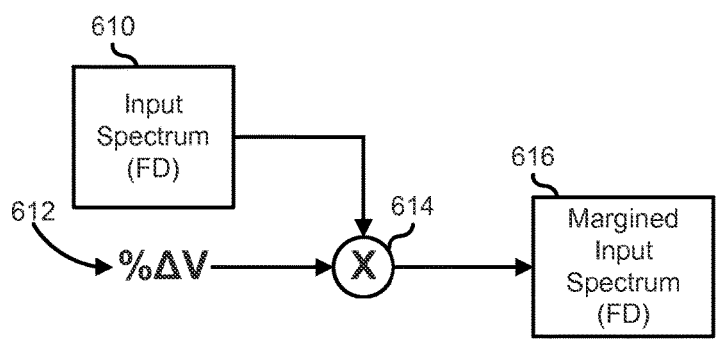
FIG. 6 is an illustration of a method of margining an input spectrum in the simulation environment of FIG. 1.

FIG. 6 illustrates how a voltage supply margin for a memory channel similar to memory channel 200 is accounted for a transmission input bitstream similar to transmission input bitstream 110. Here, an input spectrum 410 is derived from the transmission input bitstream by performing a FFT on the transmission input bitstream. Then a voltage margin factor 412 is multiplied with input spectrum 410 by a multiplier 414 to provide a margined input spectrum 416. Then, evaluations of margined input spectrum 416 can be performed by a simulation environment similar to simulation environment 100.

Figure 7:
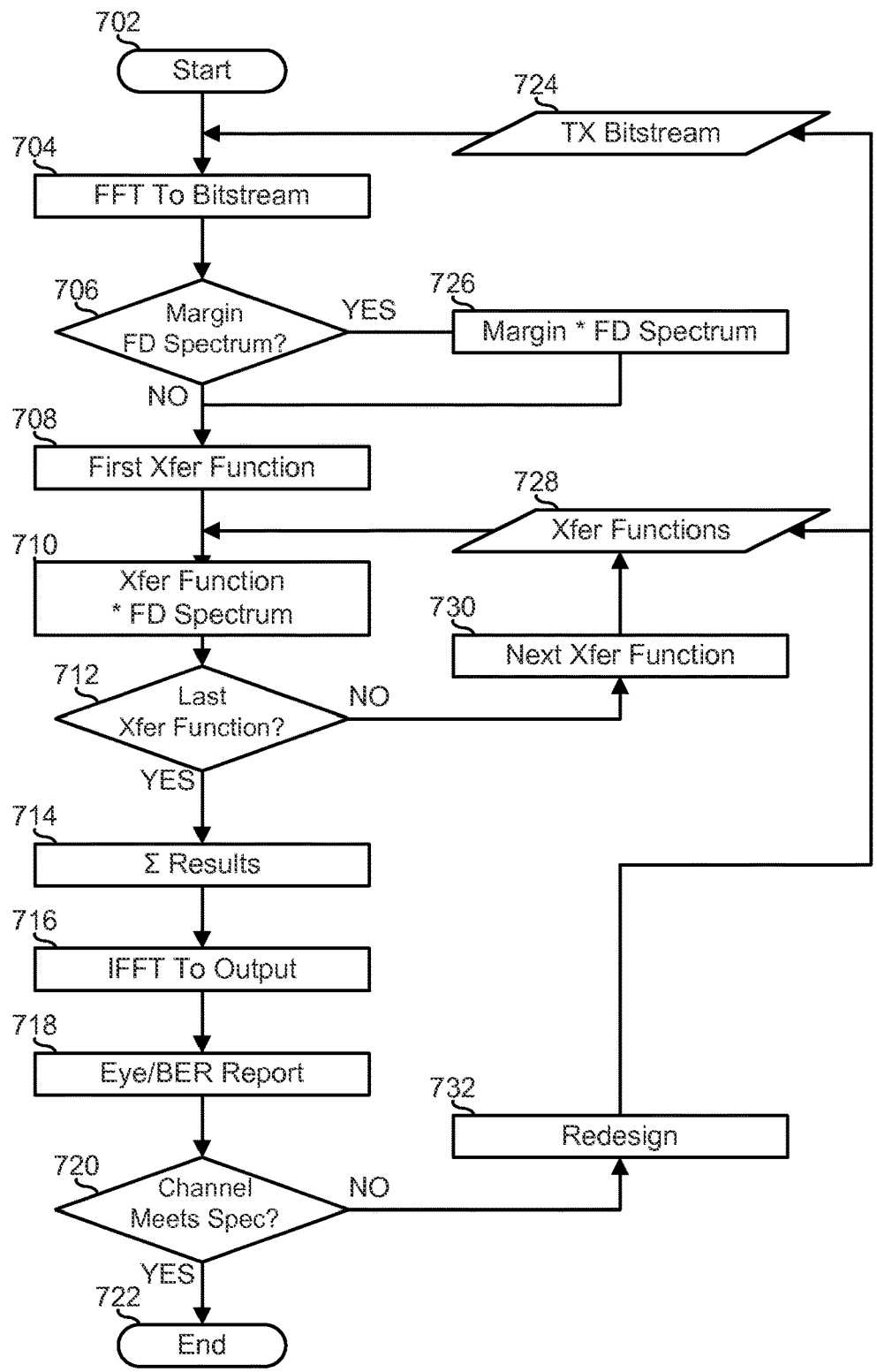
FIG. 7 is a flowchart illustrating a method of simulation for next generation memory technology according to an embodiment of the present disclosure.

FIG. 7 illustrates a method of simulation for next generation memory technology, starting at block 702. A FFT is performed on a transmission input bitstream for a memory channel in block 704. For example, simulation environment 100 can receive transmission input bitstream input 110, and can perform a FFT on the transmission input bitstream input to provide a frequency-domain representation of input spectrum 112 associated with the transmission input bitstream input. The transmission input bitstream is provided from a transmission input bitstream file 724, and can be a randomly generated bitstream or can include one or more sequences of bits that are chosen based upon a designer's knowledge of certain worst case or corner conditions for the memory channel, as needed or desired. In a particular embodiment, a reference voltage for the memory channel is determined for inclusion in the transmission input bitstream as described with respect to FIG. 4, above.

A decision is made as to whether or not the FD input spectrum is to be margined to account for different input voltage levels in decision block 704. For example, margining of a supply voltage can affect a resulting signal eye for the memory channel, as described above, with respect to FIG. 5. If the FD input spectrum is to be margined, the "YES" branch of decision block 704 is taken, the FD input spectrum is multiplied by the margin in block 726, and the method returns to block 708, as described below. For example, a FD input spectrum can be multiplied by a voltage margin as described in FIG. 6. If the FD input spectrum is not to be margined, the "NO" branch of decision block 706 is taken, and the method proceeds to block 708 where a first transfer function is selected. For example, one of a forward channel transfer function input, a DDR cross-talk transfer function input, a voltage regulator transfer function input, a power plane resonance transfer function input, a broadside coupling transfer function, and an other interface cross-talk transfer function input can be selected as the first transfer function.

The selected transfer function is multiplied with the FD input spectrum in block 710 to provide a transfer function result. The selected transfer function is received from a transfer function file 726. Transfer function file 726 can be provided based upon a circuit simulation of the memory channel and the various transfer function mechanisms, and is received from a circuit simulator such as a SPICE simulator or the like. A decision is made as to whether or not the selected transfer function is the last transfer function in decision block 712. If not, the "NO" branch of decision block 712 is taken, the next transfer function is selected in block 730, and transfer function file 728 provides the next transfer function to be multiplied by the FD input spectrum in block 710. If the selected transfer function is the last transfer function, the "YES" branch of decision block 712 is taken, and the transfer function results are summed in block 714. An IFFT is performed on the total of the summed transfer function results in block 716, and an eye diagram and a BER report are generated in block 718.

A decision is made as to whether or not the memory channel meets a channel specification in decision block 720. If so, the "YES" branch of decision block 720 is taken and the method ends in block 722. If the memory channel does not meet the channel specification, the "NO" branch of decision block 720 is taken and the memory channel is redesigned in block 732. For example, the redesign can provide new or different inputs to transmission input bitstream file 724, or provide new or improved models of the memory channel for simulating new transfer functions for transfer function file 728.

Figure 8:
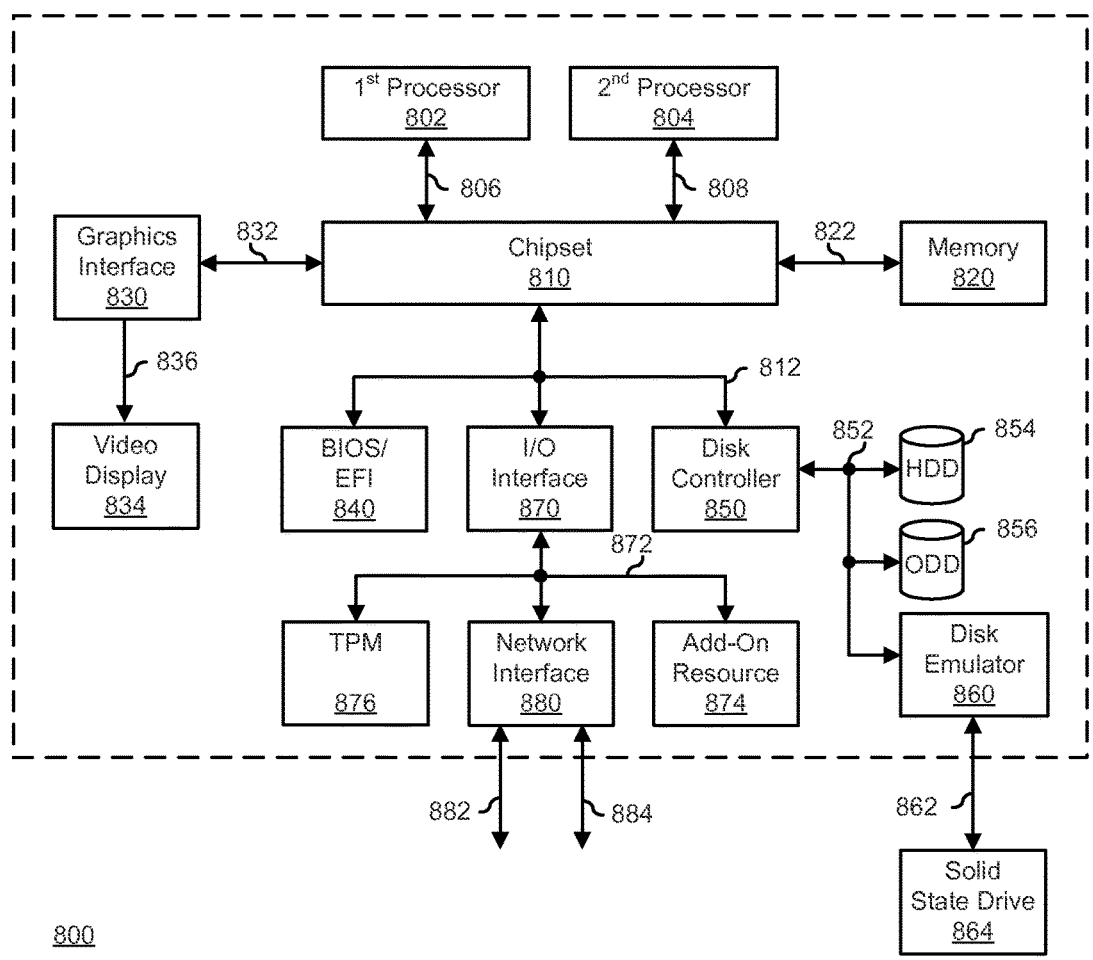
FIG. 8 is a block diagram illustrating a generalized information handling system according to an embodiment of the present disclosure.

FIG. 8 illustrates a generalized embodiment of information handling system 800. For purpose of this disclosure information handling system 800 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 800 can include processing resources for executing machine-executable code, such as a central processing unit (CPU), a programmable logic array (PLA), an embedded device such as a System-on-a-Chip (SoC), or other control logic hardware. Information handling system 800 can also include one or more computer-readable medium for storing machine-executable code, such as software or data. Additional components of information handling system 800 can include one or more storage devices that can store machine-executable code, one or more communications ports for communicating with external devices, and various input and output (I/O) devices, such as a keyboard, a mouse, and a video display. Information handling system 800 can also include one or more buses operable to transmit information between the various hardware components.

Information handling system 800 can include devices or modules that embody one or more of the devices or modules described above, and operates to perform one or more of the methods described above. Information handling system 800 includes a processors 802 and 804, a chipset 810, a memory 820, a graphics interface 830, include a basic input and output system/extensible firmware interface (BIOS/EFI) module 840, a disk controller 850, a disk emulator 860, an input/output (I/O) interface 870, and a network interface 880. Processor 802 is connected to chipset 810 via processor interface 806, and processor 804 is connected to the chipset via processor interface 808. Memory 820 is connected to chipset 810 via a memory bus 822. Graphics interface 830 is connected to chipset 810 via a graphics interface 832, and provides a video display output 836 to a video display 834. In a particular embodiment, information handling system 800 includes separate memories that are dedicated to each of processors 802 and 804 via separate memory interfaces. An example of memory 820 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 840, disk controller 850, and I/O interface 870 are connected to chipset 810 via an I/O channel 812. An example of I/O channel 812 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 810 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 840 includes BIOS/EFI code operable to detect resources within information handling system 800, to provide drivers for the resources, initialize the resources, and access the resources. BIOS/EFI module 840 includes code that operates to detect resources within information handling system 800, to provide drivers for the resources, to initialize the resources, and to access the resources.

Disk controller 850 includes a disk interface 852 that connects the disc controller to a hard disk drive (HDD) 854, to an optical disk drive (ODD) 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, USB interface, a proprietary interface, or a combination thereof. Disk emulator 860 permits a solid-state drive 864 to be connected to information handling system 800 via an external interface 862. An example of external interface 862 includes a USB interface, an IEEE 1394 (Firewire) interface, a proprietary interface, or a combination thereof. Alternatively, solid-state drive 864 can be disposed within information handling system 800.

I/O interface 870 includes a peripheral interface 872 that connects the I/O interface to an add-on resource 874, to a Trusted Platform Module (TPM) 876, and to network interface 880. Peripheral interface 872 can be the same type of interface as I/O channel 812, or can be a different type of interface. As such, I/O interface 870 extends the capacity of I/O channel 812 when peripheral interface 872 and the I/O channel are of the same type, and the I/O interface translates information from a format suitable to the I/O channel to a format suitable to the peripheral channel 872 when they are of a different type. Add-on resource 874 can include a data storage system, an additional graphics interface, a network interface card (NIC), sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a NIC disposed within information handling system 800, on a main circuit board of the information handling system, integrated onto another component such as chipset 810, in another suitable location, or a combination thereof. Network interface device 880 includes network channels 882 and 884 that provide interfaces to devices that are external to information handling system 800. In a particular embodiment, network channels 882 and 884 are of a different type than peripheral channel 872 and network interface 880 translates information from a format suitable to the peripheral channel to a format suitable to external devices. An example of network channels 882 and 884 includes InfiniBand channels, Fibre Channel channels, Gigabit Ethernet channels, proprietary channel architectures, or a combination thereof. Network channels 882 and 884 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system for simulating a memory channel, the information handling system comprising:
    a memory for storing code; and
    a processor operative to execute code to:
        model a design of a memory channel to provide a plurality of transfer functions associated with the design, wherein a particular one of the transfer functions models a memory configuration on the memory channel;
        perform a Fast Fourier Transform (FFT) on an input bitstream to the memory channel to provide an input spectrum;
        multiply the input spectrum with each of the transfer functions to provide a plurality of results;
        sum the results to provide an output spectrum for the design;
        perform an inverse FFT on the output spectrum to provide an output signal for the design;
        generate an eye diagram from the output signal; and
        determine a bit error rate (BER) for the design based on the eye diagram.

2. The information handling system of claim 1, wherein the plurality of transfer functions comprise a forward memory channel transfer function, a memory channel cross-talk transfer function, a voltage regulator transfer function, a power plane resonance transfer function, and a broadside coupling transfer function.

3. The information handling system of claim 2, wherein the processor is further configured to:
    receive the forward memory channel transfer function, the memory channel cross-talk transfer function, the voltage regulator transfer function, the power plane resonance transfer function, and the broadside coupling transfer function from a circuit simulation of the design.

4. The information handling system of claim 1, wherein the processor is further configured to:
    determine that the design meets a specification based upon the BER.

5. The information handling system of claim 1, wherein the input bitstream comprises greater than one million bits.

6. The information handling system of claim 1, wherein the input bitstream comprises a random sequence of bits.

7. The information handling system of claim 1, wherein the input bitstream comprises a sequence of bits associated with a worst case condition for the memory channel.

8. A method for simulating a memory channel, the method comprising:
    modeling a design of a memory channel to provide a plurality of transfer functions associated with the design, wherein a particular one of the transfer functions models a memory configuration on the memory channel;
    performing a Fast Fourier Transform (FFT) on an input bitstream to the memory channel to provide an input spectrum;
    multiplying the input spectrum with each of the transfer functions to provide a plurality of results;
    summing the results to provide an output spectrum for the design;
    performing an inverse FFT on the output spectrum to provide an output signal for the design;
    generating an eye diagram from the output signal; and
    determining a bit error rate (BER) for the design based on the eye diagram.

9. The method of claim 8, wherein the plurality of transfer functions comprise a forward memory channel transfer function, a memory channel cross-talk transfer function, a voltage regulator transfer function, a power plane resonance transfer function, and a broadside coupling transfer function.

10. The method of claim 9, further comprising:
    receiving the forward memory channel transfer function, the memory channel cross-talk transfer function, the voltage regulator transfer function, the power plane resonance transfer function, and the broadside coupling transfer function from a circuit simulation of the design.

11. The method of claim 8, further comprising:
    determining that the design meets a specification based upon the BER.

12. The method of claim 8, wherein the input bitstream comprises greater than one million bits.

13. The method of claim 8, wherein the input bitstream comprises a random sequence of bits.

14. The method of claim 8, wherein the input bitstream comprises a sequence of bits associated with a worst case condition for the memory channel.

\* \* \* \* \*